United States Patent
Meyer

(10) Patent No.: US 6,927,612 B2
(45) Date of Patent: Aug. 9, 2005

(54) CURRENT STARVED DAC-CONTROLLED DELAY LOCKED LOOP

(75) Inventor: Daniel J. Meyer, Woodstock, MD (US)

(73) Assignee: Atmel Corporation, San Jose, CA (US)

( * ) Notice: Subject to any disclaimer, the term of this patent is extended or adjusted under 35 U.S.C. 154(b) by 0 days.

(21) Appl. No.: 10/836,704

(22) Filed: Apr. 29, 2004

(65) Prior Publication Data

US 2005/0077937 A1     Apr. 14, 2005

Related U.S. Application Data

(60) Provisional application No. 60/510,739, filed on Oct. 10, 2003.

(51) Int. Cl.[7] .................................................. H03L 7/06
(52) U.S. Cl. ..................................... 327/156; 327/147
(58) Field of Search .............................. 327/147–163; 331/17, 25; 375/373–376

(56) References Cited

U.S. PATENT DOCUMENTS

| 5,334,952 | A | * | 8/1994 | Maddy et al. | 331/1 A |
| 6,204,705 | B1 |  | 3/2001 | Lin | 327/161 |
| 6,239,633 | B1 |  | 5/2001 | Miyano | 327/158 |
| 6,269,051 | B1 |  | 7/2001 | Funaba et al. | 365/233 |
| 6,323,705 | B1 |  | 11/2001 | Shieh et al. | 327/158 |
| 6,492,852 | B2 |  | 12/2002 | Fiscus | 327/158 |
| 6,570,420 | B1 |  | 5/2003 | Trivedi et al. | 327/156 |
| 6,691,214 | B1 | * | 2/2004 | Li et al. | 711/167 |

* cited by examiner

Primary Examiner—Linh My Nguyen
(74) Attorney, Agent, or Firm—Schneck & Schneck; Thomas Schneck

(57) ABSTRACT

A delay locked loop circuit with improved restart features. The circuit includes a clock input, a clock output, a divider circuit, phase detector and control logic. The circuit includes a means for implementing a binary search of outputs from the control logic for generating a calibration bit, which is applied to the transmission on an output line.

14 Claims, 4 Drawing Sheets

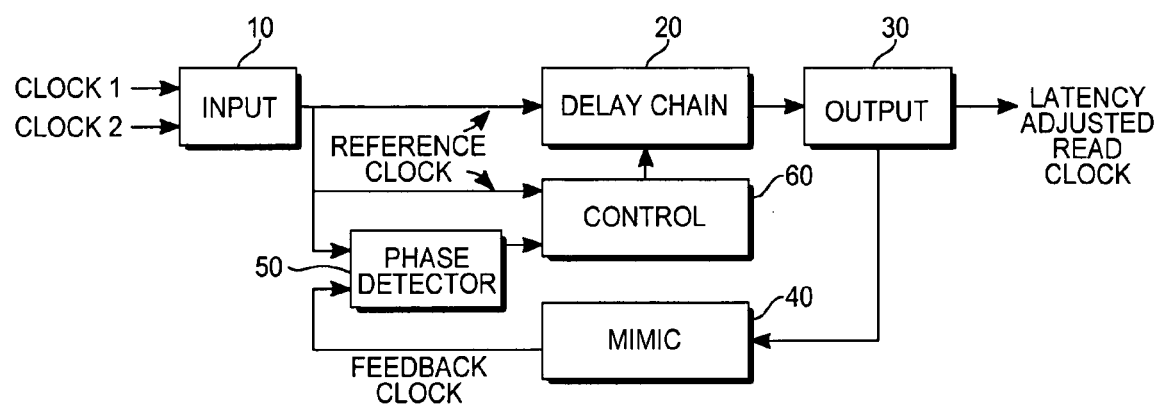
Fig._1 (Prior Art)

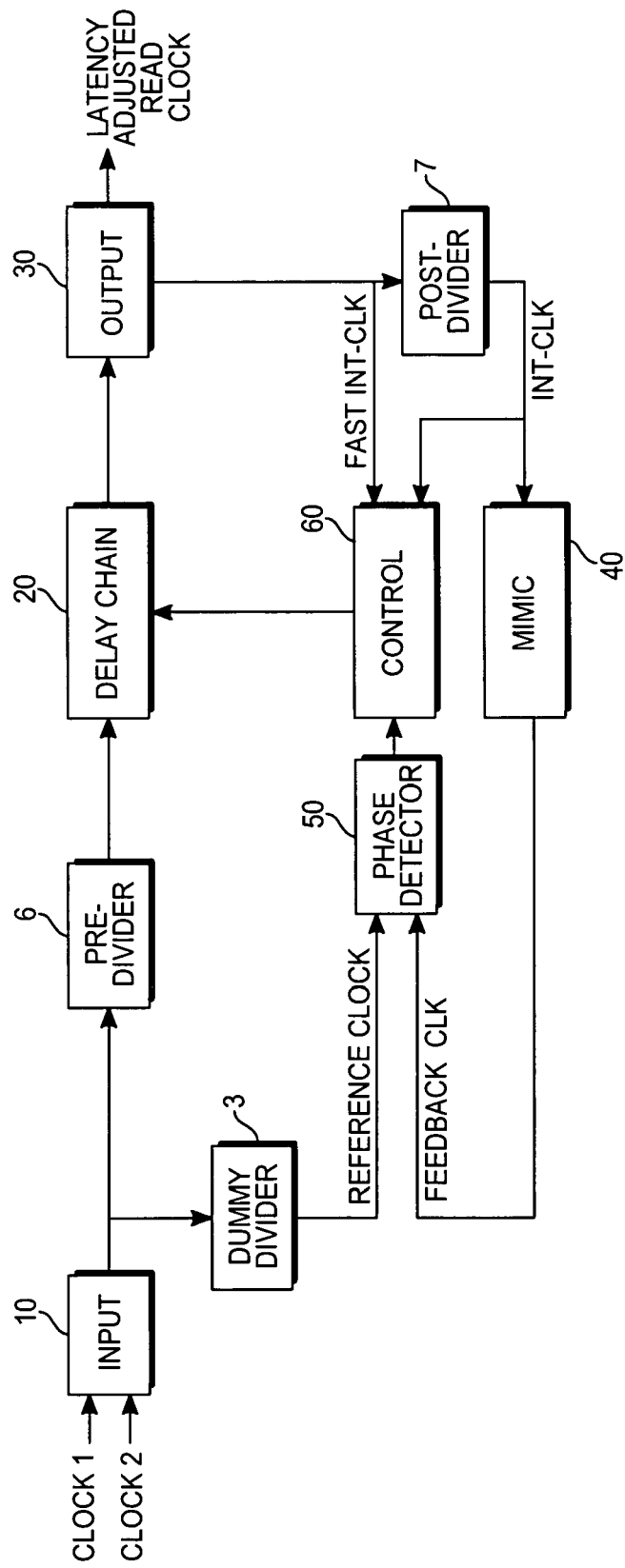
Fig._2 (Prior Art)

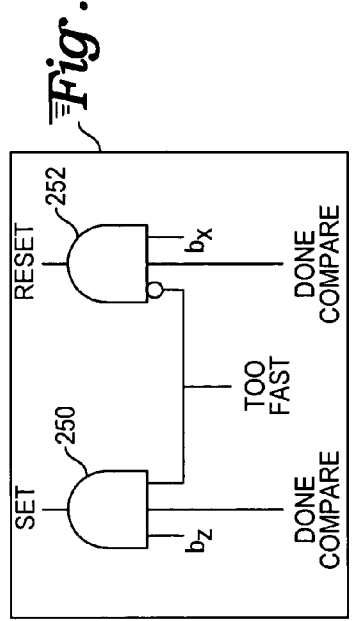
Fig._4
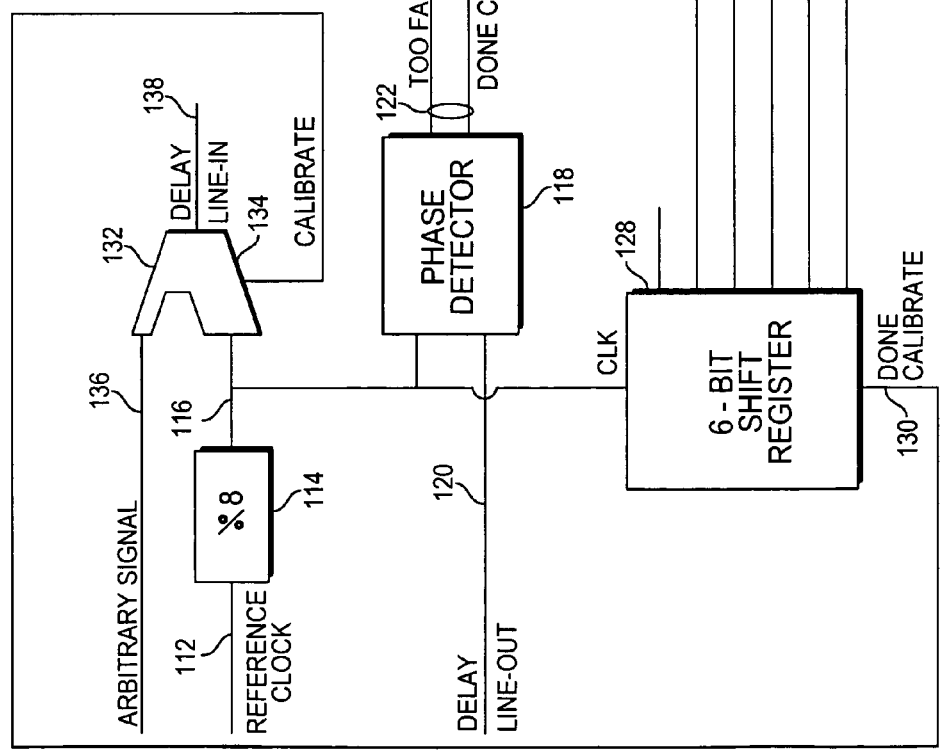
Fig._3

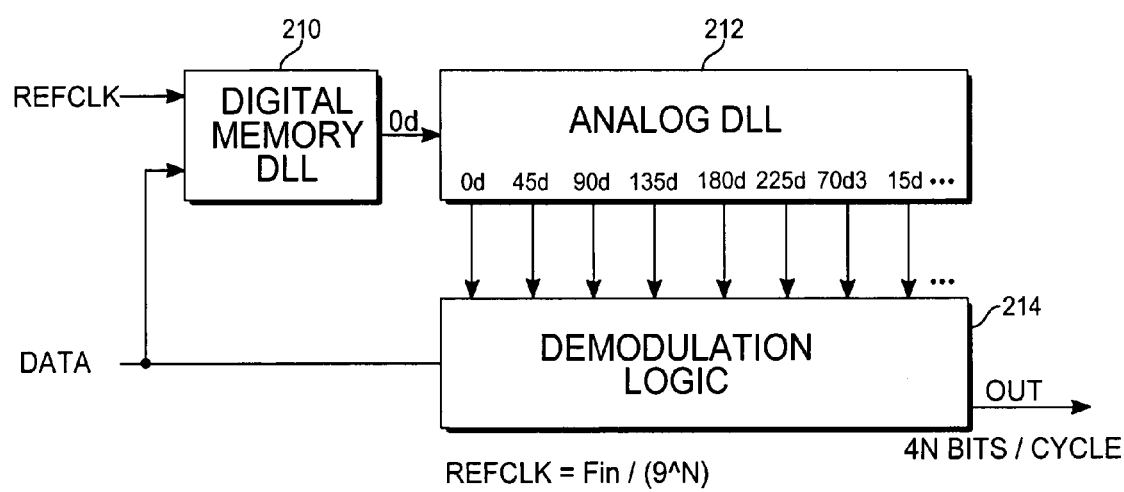
Fig. _5

CURRENT STARVED DAC-CONTROLLED DELAY LOCKED LOOP

CROSS-REFERENCE TO RELATED APPLICATION

This application claims priority from U.S. provisional application No. 60/510,739, filed Oct. 10, 2003.

TECHNICAL FIELD

The present invention relates to semiconductor circuits, and more specifically to an improved delay locked loop (DLL) design for power conservation and rapid shut down and restart.

BACKGROUND ART

The design of current starved delay cells is relatively well known in the art. A pair of cascading CMOS inverters, with an additional p- and n-channel transistor inserted into the current path and mirrored from a reference current will establish a fixed delay through a cell. However traditional current-starved DLL designs have a number of drawbacks. The current values must be exact and must match the delay circuit. Short delays for an input signal require high operating current. To compensate for other variations, such as voltage supply or temperature variations, requires high value current mirrors. These features increase power requirements. In addition, such systems can be subject to noise interference.

Under real world conditions, delay through the cell will vary significantly with the introduction of non-ideal conditions, such as varying voltage, varying temperature, and variation in process. The voltage variation can be controlled by regulating voltage supply, and a reference can be designed to provide negative feedback. Temperature variations can also be dealt with to some degree by negative feedback, however temperature usually varies relatively slowly. Consequently, temperature has a relatively low impact on the actual delay.

Process variation is the primary source of delay error. Process variations can include different threshold voltages, width and length of the transistors, dopant concentrations, and so on. Typically, all devices on the same die will undergo similar process variations, although there will always be some mismatch between devices, such as trapped charge under a gate oxide.

In prior designs, a number of different delay locked loop circuits have been designed from analog, digital, or a combination of analog and digital circuits. These delay locked loop circuits allow for adjustable delay for the circuit.

A number of prior delay lock loop designs have been described. These include DLL designs disclosed in U.S. Pat. Nos. 6,570,420; 6,492,852; 6,323,705; and 6,269,051 all hereby incorporated by reference herein.

FIGS. 1 and 2 illustrate the state of the art in delay locked loop design as illustrated in some of the above references. With reference to FIG. 1, two external signals, Clock 1 and Clock 2, are connected to an input circuit 10, which receives and amplifies the signals. As noted, the signal must be amplified to compensate for noise. Input 10 then transmits a reference clock signal. The operation of the control 60 is synchronous with the reference clock signal. The reference clock signal is connected to the input of the delay chain and the phase detector 50. The reference clock is delayed by the delay circuit 20 and passed to the output 30. The resulting signal is split in the output 30 into two signals. One signal is the output signal of the delayed clock read. The second signal is sent to the mimic circuit 40. The output signal of the mimic circuit 40 is the feedback clock signal.

A phase detector 50 detects the phase difference between the reference clock signal and the feedback clock signal. A delay control circuit 60 receives the phase difference signal as an input from the output of the phase detector circuit 50. This delay control circuit 60 includes logic circuits to process instructions from the phase detector. The phase detector can detect and indicate whether the feedback clock signal is received before or after the reference clock signal. This information is sent to the control circuit 60. Control circuit 60 receives the signal and instructs the delay chain 20 to increase or decrease the delay. This inspection and correction process continues until the delay locked loop has correctly adjusted the total propagation time of the delay chain 20 such that the reference clock and feedback clock signals align at the phase detector 50. Once the signals are aligned, the loop is locked. If the mimic circuit 40 accurately reflects the delay to be adjusted by the DLL, the configuration will produce a latency adjusted read clock to be used to clock data. The adjusted clock can be used to control other on-chip data processing circuits and out put data line signals synchronized with the external clock.

This configuration allows a reference clock to provide the clock signal for data transmission. However this configuration still has a relatively high power requirement. One means of addressing this problem is to use a divider circuit, as shown in FIG. 2. This circuit is similar to the design of FIG. 1. This design additionally includes a plurality of dividers including a predivider circuit 6, a dummy divider circuit 3 and a post divider circuit 7 that respectively divide the signal to the delay chain 20, phase detector 50 and the signal to the mimic circuit 40 and the control logic 60 respectively. This delay locked loop acts much the same as the DLL in FIG. 1, with the added feature that the delay locked loop now operates at a lower power, given that the signals from the input and the feedback have both been divided. The output of an adjusted clock may be used for clocking data transmission.

This configuration uses the frequency divider for power reduction. Lowering the amount of current required for both the input and the feedback loop. In addition the control circuit must include a lock detector circuit.

SUMMARY OF THE INVENTION

The present invention provides a digitally controlled delay locked loop that can be shut down and rapidly restarted for the purpose of generating phase delays. This development provides a power efficient circuit having rapid lock times and restart times. This is achieved by having a lock time using a binary search.

The present invention uses a frequency divider for the purpose of increasing the lock-in range of the phase detector. By increasing the lock-in range of the phase detector, this guarantees that the phase detector will line in at the correct frequency. In the past, frequency divider circuits have been used for power consumption reduction, but not for the purpose of increasing lock-in range of the phase detector.

The present invention also uses a binary search in the DAC, which provides a faster lock time than the prior art increment/decrement counters. Additionally, this binary search used in the present invention provides a fixed time for calibration, so that a lock detector circuit is not required. The multiplexing delay chain between lock mode and free running mode saves space, reduces power requirements and allows better performance over known DLL designs.

Arbitrarily accurate and absolute delay generation under varying conditions of voltage, process and temperature is possible using current starved DAC-fed calibration. The delay through a chain of basic delay element cells can be calibrated to a known value. A delay locked loop with a phase detector and a digital loop filter can be used to feed a DAC. Once lock has been established, the phase detector can be disengaged, and the loop filter value can be stored indefinitely allowing the calibrated delay chain to be used for other purposes.

BRIEF DESCRIPTION OF THE DRAWINGS

FIG. 1 is a block diagram of a prior art delay locked loop.

FIG. 2 is a block diagram of a prior art delay locked loop including dividers.

FIG. 3 is a block diagram of an embodiment of a digital delay locked loop.

FIG. 4 is a schematic diagram of a control logic used with the delay locked loop circuit of FIG. 3.

FIG. 5 is a block diagram of a system in which the delay locked loop is included.

DETAILED DESCRIPTION OF THE INVENTION

The present invention uses a digitally controlled delay locked loop to establish a fixed time through a chain of delay cells. A reference signal (for example a square wave with a period of the desired delay through the chain) is fed into the phase detector. The phase detector provides one high-going pulse to the delay chain. The detector then determines which comes first: a subsequent pulse in a reference signal or an output from the delay chain. A digital accumulator-register flips states based on a result of the proceeding determination. The accumulator register feeds a digital analog converter that provides a current reference for the delay chain.

The present invention proves several design features that provide improved performance over the prior art. The phase detector sends, for example, one in eight pulses to the delay chain. This removes any possibility of locking to the wrong response since the delay chain will not currently have a pulse in it when a pulse is sent. It also gives the DAC sufficient settling time. This ensures that response from the delay chain is accurate.

Additionally, instead of a classic increment/decrement counter, a binary search mode is employed. Here, the DAC inputs use inverse logic, as it is a current mode DAC with binary weighted p-channel current mirrors (from a fixed reference) switched in.

With reference to FIG. 3, an input reference signal on line 112 is divided by 8 by divider circuit 114 and the divided output on line 116 is fed to phase detector 118. Phase detector 118 compares delay line output feedback pulses on line 120 to provide a too fast/done compare outputs on line 122 to control logic 124. The control logic 124 generates set/reset pulses to an accumulator 126 that serves to implement a binary search over the bits from a most significant bit (MSB) to a least significant bit (LSB). After each comparison, if the delayed bit pulse reaches the phase detector before the next reference pulse, the compared bit is flipped. The next bit to be compared is set to a zero, and the process is repeated. After a set number of comparisons, the loop is locked. A calibration bit is shifted out of register 128 on line 130 and applied to adder 132 on calibration input line 134 for clocking an arbitrary input pulse on line 136 that is combined with the divided reference input on line 116. The adder has an output on line 138, serving as the delay line input.

In one exemplary embodiment, the accumulator register is five bits long and is initialized to 01111 (using inverse logic). Five comparisons are required to implement the binary search, from most significant to least significant (i.e., a first comparison operates on bit four, and a last comparison operates on bit zero). After each comparison, if the delayed pulse reaches the phase detector before the next reference pulse, a compared bit is flipped to a "1." The next bit to be compared is set to a "0" and the prescaler allows the DAC to settle and the process is repeated. After five comparisons are performed, the loop is locked.

With respect to FIG. 4, the control logic for each bit would include a set gate 250 and a reset gate 252. Each gate has an input from the phase detector for signals that are done and for signals that are too fast, namely the delayed pulse is detected before the sequential reference pulse. In this instance the compared bit is flipped.

For example, if a final value were to be a 20, the sequence would be as follows (recall, the sequence uses inverse logic):

Compare at: 01111
Compare at: 00111
Compare at: 01011
Compare at: 01001
Compare at: 01010
Final Value:01011

The phase detector/delay locked loop serves a specific function under the present invention. This loop comes close to the proper delay under any condition. Since the primary inaccuracies are caused by process variations, the device can be calibrated reasonably well at the factory, or calibrated in the field as long as a reference source is available. The use of the digital calibration has certain significant advantages over other DLL architecture for many applications.

A conventional analog controlled DLL requires that the DLL be kept running all the time, or allow for a potentially substantial start-up time (depending on the filter loop). Running the conventional DLL constantly can be a substantial power cost. In contrast, the DLL of the present invention can shut down everything, including the DAC, and simply run the accumulator registers at reduced voltage, for extremely low shutdown power consumption while still being able to turn on quickly. If multiple delay values are desired, the values can be stored digitally, and then recalled quickly, allowing for rapid returning. These features are not possible in an analog loop.

Additionally it may be desirable to have an input to the delay chain be some input other than the reference clock. In a conventional clock, this would mean a separate delay chain that is slaved off the tune-line of the delay cells. This requires additional power and additional size. Furthermore it may be difficult to calibrate. The cells actually being used are not the cells being calibrated, and the sensitivity to mismatch in the delay cells is substantially increased. In the present invention, these problems are abated.

The present invention may be incorporated into other circuitry. This is illustrated with respect to FIG. 5, a diagram for dual edge phase modulation (DEPM) including a digital delay locked loop. This is a new means for encoding high-speed serial data streams in order to reduce the switching frequency of transmitted data. DEPM has a number of uses, including improving throughput of a transmission line and lowering power consumption of I/O drivers.

In FIG. 5, a block diagram for a DEPM modulator used in applications where the frequency is known in advance. The delay lock loop allows power consumption reduction by using a matched static delay chain corresponding to the clock frequency. The demodulator reference is set up by aligning the reference clock (REFCLK) with the zero state of the DATA. This eliminates the need to send a synchronous clock signal with the DATA. Instead, the digital memory delay locked loop 201 and the analog delay locked loop 212 provide the clock signal for the data. The demodulation logic 214 allows the reference clock signal to used as the clock signal for the DATA.

What is claimed is:

1. A delay lock loop circuit comprising:
   a reference clock input signal;
   a delay line output;
   a divider circuit coupled to said reference clock input;
   a phase detector configured to receive signals from said delay line output and said divider, said phase detector configured to generate a phase signal;
   a control logic configured to receive compare outputs from said phase detector;
   a means for implementing a binary search of said compare outputs from said control logic for generating a calibration bit, said means configured to lock a delay loop after a set number of comparisons; and
   a means for applying the calibration bit to a transmission on an output line.

2. The circuit of claim 1, wherein said means for implementing a binary search includes a control logic register and a shift register.

3. The circuit of claim 2, wherein said control logic register is a 5 bit register.

4. The circuit of claim 3, wherein the shift register is a 6 bit register.

5. The circuit of claim 1, wherein the divider circuit divides said reference clock input signal such that timing of said reference clock input signal sent to the control logic is sent after generation of the calibration bit from any previous input.

6. The circuit of claim 1, wherein said delay line output is sent to an analog delay locked loop circuit.

7. The circuit of claim 1, wherein said divider circuit divides by 8.

8. The circuit of claim 1, wherein said means for generating the calibration bit is an adder circuit.

9. A delay lock loop circuit comprising:
   a reference clock input signal;
   a delay line output;
   a divider circuit coupled to said reference clock input;
   a phase detector configured to receive signals from said delay line output and said divider, said phase detector configured to generate a phase signal;
   a control logic configured to receive compare outputs from said phase detector;
   a control logic register;
   a shift register;
   said control logic register and shift register being configured to implement a binary search of compare outputs from said control logic and generate a calibration bit, said shift register being configured to implement a binary search to lock a delay loop after a set number of comparisons; and
   an adder for applying the calibration bit to a transmission on an output line.

10. The circuit of claim 9, wherein said control logic register is a 5 bit register.

11. The circuit of claim 9, wherein said shift register is a 6 bit register.

12. The circuit of claim 9, wherein the divider divides said reference clock input signal such that timing of said reference clock input signal sent to the control logic is sent after generation of the calibration bit from any previous input.

13. The circuit of claim 9, wherein said delay line output is sent to an analog delay locked loop circuit.

14. The circuit of claim 9, wherein said divider circuit divides by 8.

* * * * *